(12) United States Patent
Bussy

(10) Patent No.: US 12,724,059 B2
(45) Date of Patent: Sep. 1, 2026

(54) DETECTING AN ELECTRIC ARC BY MEANS OF A BRAGG GRATING

(71) Applicant: SAFRAN, Paris (FR)

(72) Inventor: Emmanuel Bussy, Moissy-Cramayel (FR)

(73) Assignee: SAFRAN, Paris (FR)

( * ) Notice: Subject to any disclaimer, the term of this patent is extended or adjusted under 35 U.S.C. 154(b) by 166 days.

(21) Appl. No.: 18/844,730

(22) PCT Filed: Mar. 9, 2023

(86) PCT No.: PCT/FR2023/050317
§ 371 (c)(1),
(2) Date: Sep. 6, 2024

(87) PCT Pub. No.: WO2023/170368
PCT Pub. Date: Sep. 14, 2023

(65) Prior Publication Data

US 2025/0189572 A1 Jun. 12, 2025

(30) Foreign Application Priority Data

Mar. 10, 2022 (FR) ...................................... 2202082

(51) Int. Cl.
*G01R 31/08* (2020.01)
*G01D 5/353* (2006.01)
(Continued)

(52) U.S. Cl.
CPC ....... *G01R 31/086* (2013.01); *G01D 5/35374* (2013.01); *G01R 31/008* (2013.01); *G01R 31/52* (2020.01)

(58) Field of Classification Search
CPC .... G01R 31/00; G01R 31/005; G01R 31/008; G01R 31/08; G01R 31/081; G01R 31/086;
(Continued)

(56) References Cited

U.S. PATENT DOCUMENTS 8,120,376 B2 * 2/2012 Hansen .............. G05B 23/0229 324/555
9,417,057 B2 * 8/2016 'T Hooft .............. G01M 11/025
(Continued)

FOREIGN PATENT DOCUMENTS

CN 111751685 A 10/2020
CN 111947893 A * 11/2020 .......... G01M 11/331
FR 3056966 A1 4/2018

OTHER PUBLICATIONS

International Search Reporting in corresponding International Patent application No. PCT/FR2023/050317, mailed Jun. 15, 2023, 2 pages, English translation only.

*Primary Examiner* — Hoai-An D. Nguyen
(74) *Attorney, Agent, or Firm* — Cozen O'Connor

(57) ABSTRACT

An electrical distribution route for an aircraft includes electrical cables and electrical connection interface members, and a diagnostic and detection device for diagnosing and detecting an arc fault in the electrical distribution route. The diagnostic and detection device includes an optical fiber laid along the entire distribution route and having at least one Bragg grating at each connection interface member, an optical reflectometer coupled to an upstream end of the optical fiber, and an acquisition central processing unit configured to detect and locate one or more arc faults over a connection interface member by comparing the current spectral signature with the reference spectral signature of the optical fiber.

13 Claims, 4 Drawing Sheets

(51) Int. Cl.
*G01R 31/00* (2006.01)
*G01R 31/52* (2020.01)

(58) Field of Classification Search
CPC .... G01R 31/12; G01R 31/1218; G01R 31/50; G01R 31/52; G01D 5/00; G01D 5/26; G01D 5/32; G01D 5/34; G01D 5/353; G01D 5/3537
USPC .......................................... 324/500, 512, 536
See application file for complete search history.

(56) References Cited

U.S. PATENT DOCUMENTS

2010/0321838 A1 12/2010 Wu et al.
2014/0072296 A1* 3/2014 Montalvo Garcia ........................ H04B 10/0775 398/16

* cited by examiner 8
2
6

4
8
6

16
16
16
12
10
14
16
16
16

DETECTING AN ELECTRIC ARC BY MEANS OF A BRAGG GRATING

CROSS-REFERENCE TO RELATED APPLICATIONS

This application is a US National phase Application of PCT/FR2023/050317 filed Mar. 9, 2023, which claims priority to French Patent Application No. 2202082 filed Mar. 10, 2022, both of which are hereby incorporated in their entirety.

TECHNICAL FIELD

This document falls within the framework of electric arc detection in an aeronautical environment.

BACKGROUND

In the aeronautical field, aircraft are equipped with electrical power distribution networks to supply devices such as flight controls and the loads associated with life on board. More recently, the electrical hybridization of aircraft propulsion has been the subject of studies in which electrical networks are heavily involved.

The electrical network is composed of a power generation system, called a source, ensuring availability of the power to be distributed across all loads. To ensure this distribution, the electrical network is also composed of electrical distribution cabinets which fulfill the roles of routing, protection, power cut-off, and interconnection. Next, the electrical network has an electrical distribution system called an Electrical Wiring Interconnection System or EWIS. This is composed of distribution harnesses, also called routes. A distribution route defines one or more cables of a harness supplying power to an electrical load. Each route is equipped upstream, at the distribution cabinet for example, with a protection and cut-off system. Usually, the protection systems perform an electrical health diagnosis on the lines by measuring the line current using dedicated sensors. The harnesses are composed of electrical cables sized to carry the current, electrical interfaces such as connectors or terminal blocks, and mechanical elements associated with the passive protection of the harnesses, such as sheaths, or associated with the installation of the harnesses in the structure of the aircraft, such as clamps and retaining clips. Finally, at the end of the route, the cables are connected to the electrical loads to which they supply power.

These distribution routes are thus present between the source and a distribution cabinet, possibly between a primary distribution cabinet and a secondary distribution cabinet and then between a distribution cabinet and an electrical load. Each route is therefore equipped with at least two electrical interfaces, such as connectors or terminal blocks. The first electrical interface is located upstream of the route and the second one downstream, thus enabling the connection of the upstream and downstream devices to said routes. In some cases, these routes are also equipped with intermediate interfaces, thus dividing said routes into several sections.

The electrical network is subject to the appearance of physical phenomena. The components and systems dedicated to the transport of electrical power are designed to avoid these dreaded phenomena. However, certain causes may result in their appearance. For example, we can cite the aging caused by environmental constraints or external factors, human or otherwise. The electric arc fault (also referred to herein as arc fault) is one of these phenomena.

An electric discharge occurs when a gas is exposed to an electric field exceeding a breakdown voltage, called the disruptive voltage. An electric arc is a disruptive discharge with high current, self-sustained at low voltage levels. The electric arc instigates physicochemical interactions within a highly ionized gas that conducts current perfectly. An arc fault is an unwelcome electric arc that can appear on each of the components in the electrical power distribution network after a failure of one or more of these components. For example, it is known that chemical, electrical, or mechanical interactions are the main causes of failure modes resulting in the generation of arc faults.

As illustrated in FIGS. 1 and 2, there are two types of arc faults. The first, called a parallel arc 2, is an electric arc that is created between two electrical conductors at different potentials supplied by a source 8. For example, a parallel arc 2 can appear between two phases or between a phase and a ground. It is the consequence of a decrease in the dielectric strength between these conductors. This decrease is the consequence of insulator degradation and a reduction in the distance between electrodes, for example by the insertion of an external liquid or solid material that is conductive. Parallel arc 2 then establishes an electrical continuity of very low impedance occurring in parallel with electrical load 6, which more or less short-circuits it. In practice, this is generally easy to observe by measuring the line current, because a strong current draw is induced during the arc. The second type of arc fault is the series arc 4. It results from a discontinuity in the current loop between source 8 and electrical load 6. Typically, series arc 4 occurs locally within the upstream, downstream, or intermediate electrical interfaces. It is the result of failure modes in these interfaces such as a hot disconnect between male and female electrical contacts related to a manufacturing or maintenance problem or consequences due to the aging imposed by aeronautical stresses. Mechanical vibrations, thermal cycles related to flight phases (altitude variation) may be the origin, for example, of a corrosion of electrical contacts which is also called fretting corrosion, this corrosion being a precursor to the appearance of a series arc 4. Unlike the parallel arc 2, the series arc 4 is extremely difficult to diagnose using current measurements. At best, it generates a small inflection in the current which generally remains within the nominal operating ranges of the electrical loads 6. More complex algorithms for detecting the series arc 4 by adding layers of signal processing are being studied, but the high variability of the loads and the environmental constraints make these not very robust.

In aeronautics, every effort is made to limit the occurrence of these phenomena as much as possible and to limit their consequences when they appear. In today's aircraft, an overall strategy has been deployed to achieve this. We can cite the following measures in particular.

Limiting the AC voltage that is distributed, to 230/400 volts. These low voltage levels are the levels proposed at the minima of the Paschen curves. This prevents any possibility of an arc being initiated by overvoltage, including at high altitudes for devices located in depressurized areas. This also limits the expansion of any electric arc as its electric field cannot exceed the network voltage.

Distribution of an AC voltage waveform encourages self-extinction of the electric arc at each half-period.

Given the problem of maintaining the arc in DC current waveforms, distributed DC networks are at very low voltage, typically 28 volts.

The design and routing rules for harnesses are adapted to take into account the impact of the arc on its environment.

Finally, line diagnostic devices based on current measurement allow detecting the majority of parallel arcs. These devices are coupled with cut-off systems in order to isolate and protect a line impacted by an arc fault, among other things.

This solid mitigation strategy is what has made it possible to not have mandatory detection of arc faults in the electrical power distribution networks on board today's aircraft.

The studies carried out within the context of the increasing power for propulsion and non-propulsion networks have demonstrated the need for higher voltage electrical power distribution networks and possibly a distribution using DC. Such changes could increase the risk of arc faults and aggravate the associated damage. The increased density in cabling related to the increase in the number of devices carried on board and the complexity of these devices are aggravating factors. The overall mitigation strategy must therefore be reassessed and the detection of arc faults on board aircraft is one solution that could be required.

Techniques are known for detecting arc faults, based on an optical measurement of the light variations generated by an arc fault, by deploying an optical fiber coupled to a receiver for light spectrum measurement and analysis. The external protective sheath of the optical fiber that mechanically protects the fiber core must be translucent in order to allow optical variations resulting from arc faults to be captured. Consequently, a disadvantage of this optical measurement is the deployment of an optical fiber in which the line losses will in fact be very significant.

The present invention aims to propose a reliable and robust technical solution to the problem posed by the detection of arc faults that may appear in an aircraft's electrical harness. More particularly, the invention aims to propose a reliable and robust solution for diagnosing parallel and series arc faults that may appear locally within the electrical interfaces of these harnesses.

It is difficult to design a reliable and robust system for detecting arc faults. It is necessary to take into account the wide variety of electrical loads that may be on board the aircraft, some of them possibly having signatures close to those of an arc fault. The environmental constraints imposed in aeronautics, in particular electromagnetic constraints, may impact the robustness of certain measurement systems, for example such as those based on current/voltage measurements.

The present invention aims to remedy these various technical problems by proposing a technical solution that is simple and inexpensive to implement, and is of high reliability and robustness.

SUMMARY

The invention relates to an electrical power distribution network of an aircraft, comprising a harness of electrical cables forming an electrical distribution route between a source and at least one load, said harness comprising at least one section connected in series between the source and the load or loads by at least one connection interface member, characterized in that it comprises a diagnostic and detection device for diagnosing and detecting an electric arc type fault occurring in said electrical distribution route, said diagnostic and detection device being arranged at the connection interface members; the diagnostic and detection device comprising:

- an optical fiber laid along at least a portion of said distribution route and comprising at least one Bragg grating positioned at each connection interface member, making it possible to associate with each connection interface member a characteristic reference wavelength of the respective Bragg grating, the optical fiber having a reference spectral signature comprising said characteristic wavelengths of said Bragg gratings,
- an optical reflectometer coupled to an upstream end of the optical fiber and configured to emit a reference optical signal, said reference optical signal being composed of an incident light spectrum including the characteristic wavelength of each Bragg grating of the optical fiber, and to receive a reflected optical signal composed of a light spectrum reflected by the optical fiber which defines a current spectral signature of the optical fiber,
- an acquisition central processing unit configured to detect and locate one or more arc faults over one or more connection interface members, on the basis of a comparison of the current spectral signature with a reference spectral signature of the optical fiber.

An electric arc causes a local increase in temperature. If it appears at the connection interface member, the environment close to this connection interface member will be exposed to a temperature increase for the duration of the fault. The refractive index of the associated Bragg grating is affected, which results in modifying the light spectrum reflected and received by the optical reflectometer. As is known, the silica layer patterns constituting a Bragg grating expand under the effect of a temperature increase, which causes a modification of the refractive index and therefore of the wavelength that will be reflected by this Bragg grating. Thus, comparing the current spectral signature with a reference spectral signature makes it possible to detect and determine the location of faults, including intermittent ones such as the arc faults that may appear within an electrical distribution route of an aircraft.

Such a diagnostic and detection device for monitoring aircraft electrical networks, based on the variation in the spectral signature of optical fiber Bragg gratings, is insensitive to the diverse disruptions related to an aeronautical environment, and in particular to electromagnetic and light disruptions, slow temperature variations, and mechanical vibrations and impacts, which makes it a reliable and robust device.

The detection device according to the invention makes it possible to precisely locate the arc fault by associating a Bragg grating with each connection interface member to be monitored. It advantageously benefits from the very high signal transmission speed via optical fiber.

The at least one Bragg grating may be arranged at a distance of up to 10 cm from the electrical interface member. Indeed, the range for the distance between the electrical interface member and the corresponding Bragg grating may be up to ten centimeters with no loss of detection efficiency.

In practice, the range for this distance may be adapted to optimize the criteria of reliability and robustness, depending on the electrical interface members concerned and the types and characteristics (energy, plasma) of the arc faults that may appear.

The diagnostic and detection device may be adapted to actuate a cut-off device configured to isolate said electrical distribution route from the rest of the electrical power distribution network, and the acquisition central processing unit may be configured to send an arc fault detection signal for an arc fault located at the connection interface member associated with the cut-off device in order to actuate the cut-off device.

Such a feature allows rapid and automatic isolation of the distribution route and thus prevents any propagation or aggravation of the fault.

The reflectometer may be configured to, before power is supplied to the distribution route, emit the reference optical signal and receive a reflected optical signal composed of a reflected light spectrum that is reflected by the optical fiber, said reflected light spectrum defining the reference spectral signature of the optical fiber.

Such a feature makes it possible to acquire a new spectral signature for the fiber at each start-up and thus to take into account variations in the state of the distribution route.

The reflectometer may be configured to emit the reference optical signal and receive the reflected optical signal defining the current spectral signature of the optical fiber in a continuous manner, during the supply of power to the distribution route.

Such a feature allows constant operation of the detection system, enabling a faster reaction.

The acquisition central processing unit may be configured to compare the current spectral signature and the reference spectral signature of the optical fiber by detecting a shift between one of the characteristic wavelengths of one of the Bragg gratings in the current spectral signature and in the reference spectral signature of the optical fiber.

Such a feature allows comparing the current spectral signature and the reference spectral signature in a simple and robust manner.

The characteristics of the external mechanical protective sheath of the fiber core are such that the light spectrum remains contained inside the fiber core, to allow the detection and classification of any variations in the reflected light spectrum. This advantageously makes it possible to have few line losses.

The detection device based on an optical fiber with Bragg gratings proposed in the invention allows reliable and rapid arc fault detection, which allows activating a cut-off device when necessary, making it possible to quickly stop the propagation of the arc and limit its consequences.

The reference spectrum or the reference spectral signature corresponds to a normal operating state of the electrical power distribution network, i.e. an operation where there is no malfunction such as a parallel arc fault or a series arc fault.

The detection signal according to the invention allows activating the cut-off device for the route concerned by the fault. Conversely, if the operation of the electrical power distribution network is normal, the cut-off device is not activated and the electrical power distribution network continues to operate.

The optical fiber with its Bragg gratings is configured so that each Bragg grating is located in or near the associated electrical interface member.

The invention also relates to a method for detecting a series arc, making use of a device as above in an electrical power distribution network of an aircraft, the method comprising the following steps:

- emitting a reference optical signal, said reference optical signal being composed of an incident light spectrum including the characteristic wavelength of each Bragg grating of the optical fiber, and continuously receiving a reflected optical signal composed of a light spectrum reflected by the optical fiber and defining a current spectral signature of the optical fiber,
- comparing said current spectral signature with a reference spectral signature by using the acquisition central processing unit, and detecting and locating an arc fault if there is such.

The method may further comprise the following step:

- in the event that an arc fault is detected at a connection interface member, sending an arc fault detection signal for an arc fault located at the connection interface member in question, to a cut-off device in order to actuate said cut-off device.

Such a feature allows rapid and automatic isolation of the distribution route and thus prevents any propagation or aggravation of the fault.

The method may further comprise the following steps:

- before supplying power to the distribution route, emitting a reference optical signal, and receiving a reflected optical signal composed of a light spectrum reflected by the optical fiber and defining the reference spectral signature of the optical fiber, and
- storing the reference spectral signature in the acquisition central processing unit.

Such a feature allows acquiring a new spectral signature for the fiber each time it is turned on and thus takes into account variations in the state of the distribution route.

The steps of emitting the reference optical signal and comparing the current spectral signature and the reference spectral signature may be implemented continuously during the supply of power to the distribution route.

Such a feature allows constant operation of the detection system, enabling a faster reaction.

The detection of a possible arc fault may be done by comparing the current spectral signature and the reference spectral signature, by measuring a shift of at least one characteristic wavelength of one of the Bragg gratings.

Such a feature allows the current spectral signature and the reference spectral signature to be compared in a simple and robust manner.

The step of comparing the spectral signature may comprise implementing a segregation algorithm, capable of segregating a temperature change resulting from an arc fault from a temperature change resulting from an external cause.

Such a feature allows reducing the cases of false positives in the detection of electric arcs due to external temperature changes.

The invention further relates to an aircraft comprising an electrical power distribution network as above.

BRIEF DESCRIPTION OF DRAWINGS

Other features, details and advantages will become apparent from reading the detailed description below, and from analyzing the attached drawings, in which.

DETAILED DESCRIPTION

The appearance of an electric arc is a dreaded phenomenon in aeronautics. The evolution towards aircraft that are increasingly electric requires a paradigm shift in the management of risks induced by arc faults in on-board electrical power distribution networks. If their detection is becoming an essential component in the general mitigation strategy for managing these risks, then this must be done with the assurance that the criteria for reliability and robustness of this detection are as close as possible to 100% for safety and quality reasons and so as not to compromise the other technological choices defined in this general mitigation strategy.

The reliability criterion corresponds to the ability to detect, preferably quickly, all arc faults regardless of their energy, their erratic nature, or the variability of their signatures in the electrical architecture concerned. In other words, reliability is the criterion of success in true detection. The higher it is, the more reliable the system.

The robustness criterion of the arc fault detection system evaluates its ability to detect only this type of fault and to segregate all other signatures. In other words, robustness is the criterion of ensuring the non-detection of false positives. It is linked to the measured noise level and thus represents the ability of a device to withstand environmental variations, for example. Environmental variations are quite significant for aircraft: variations in pressure, temperature, and humidity. Systems installed in aircraft must additionally undergo a plurality of electromagnetic tests in order to be qualified and certified. As the sensors installed in an aircraft are subjected to severe stresses, these sensors must not trigger unexpectedly.

In the invention, an arc fault detection device for a harness of an electrical power distribution network of an aircraft is proposed which has these qualities.

The electric arc induces numerous physical disruptions in its environment. Among these, physical phenomena close to the electrodes and within the arc column result in the emission of intense light spectra as well as emanations of liquefied or vaporized materials. Also, the electric arc generates radio frequency emissions and a local change to the temperature of the gas where it is taking place. In the invention, it is the impact of the arc on the local temperature of the gaseous environment that is exploited in the arc fault detection system according to the invention, by using an optical fiber with Bragg gratings that are judiciously positioned so that each grating is located near an electrical interface member of the harness to be monitored, coupled with a reflectometer which allows monitoring the variations in the optical spectrum that are induced by sudden temperature variations in the environment around the Bragg gratings.

Figures 1, 2, 3:
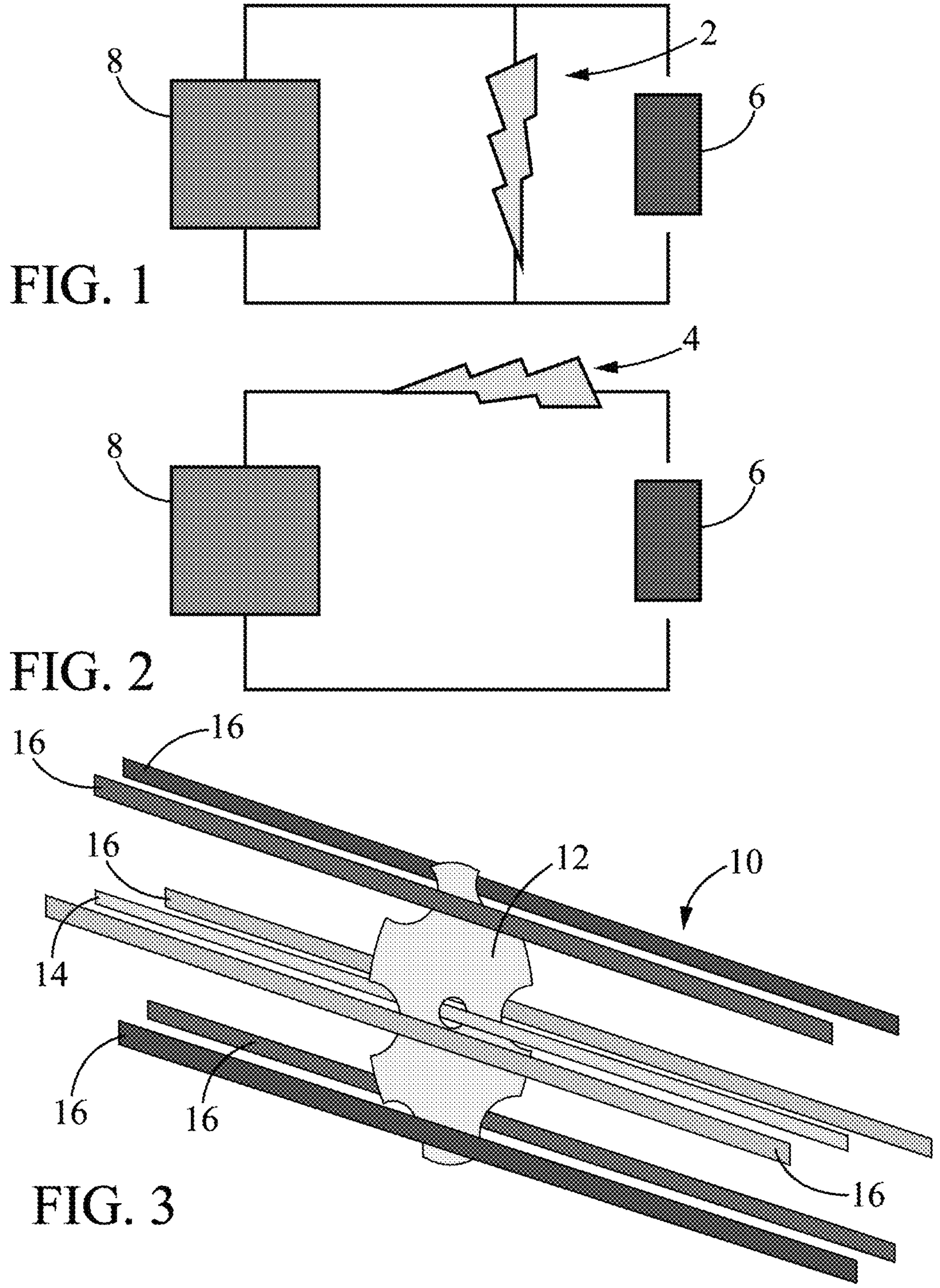
FIG. 1 shows an electrical circuit comprising a parallel arc.
FIG. 2 shows an electrical circuit comprising a series arc.
FIG. 3 shows a harness comprising electrical cables and an optical fiber which are held together by a support.
Figure 4:
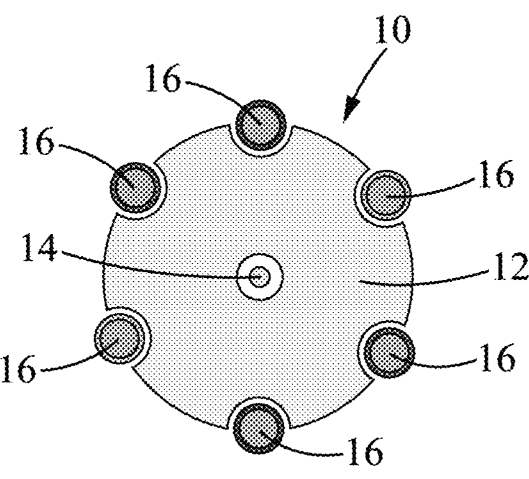
FIG. 4 shows a cross-sectional view of FIG. 3.

The detection system according to the invention is more particularly described by taking as an example, illustrated in FIGS. 3 and 4, a section of a harness of an electrical power distribution network 10, installed with a support 12, also referred to as a segregating coil. Support 12 is designed to fulfill the role of holding and segregating the electrical cables of the harness, and in particular thereby limiting the risks of the appearance and propagation of electric arcs as well as the associated damage. Such supports are used in particular for high-power distribution, involving electrical cables 16 designed to withstand high currents.

In a known manner, the harness has a cut-off device upstream, meaning towards the source, its function being to open or close the circuit lines of the component cables comprised in the harness, upon command. This command often comes from a protective system or corresponds to an external request, for example in the event of a load reconfiguration.

According to one embodiment of the invention applied to such a system, an optical fiber 14 with Bragg grating(s) is mounted in the center of the bundle of electrical cables 16, and laid along the entire length of the section, in other words alongside the electrical cables 16. Optical fiber 14 is coupled at an upstream end to an optical reflectometer. The optical reflectometer is part of a diagnostic and detection system configured to detect and react to the formation of an electric arc in the cable harness. The diagnostic and detection system, including the reflectometer, is positioned on the same side as and close to a cut-off system, responsible for the protection and opening or closing of each electrical cable 16 comprised in the harness. This proximity ensures a communication that is reliable and easy to implement, from the diagnostic system to the cut-off system, for transmitting a cut-off command when necessary.

In a known manner, the reflectometer injects an incident optical signal into optical fiber 14 and in return receives a reflected optical signal having a spectrum composed of the bright lines corresponding to the characteristic wavelengths reflected by Bragg gratings 20. It is the current spectral signature of the fiber Bragg gratings which reflects the state of Bragg gratings 20 present in optical fiber 14.

Figure 10:
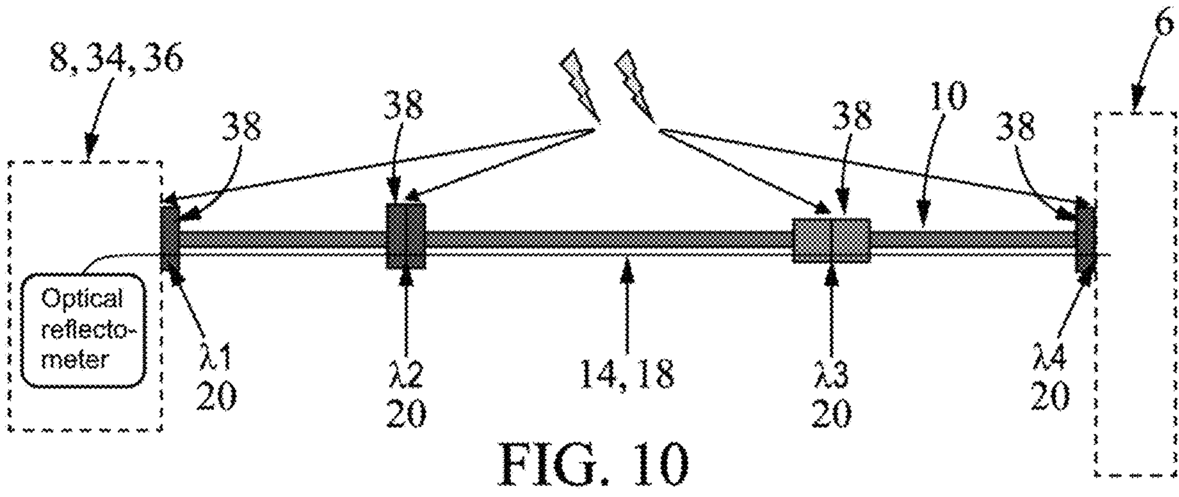
FIG. 10 shows a harness system connected to a source, and electrical connection interface members which are downstream, intermediate, and upstream and comprise a detection system according to the invention with an optical reflectometer coupled to an optical fiber with Bragg gratings deployed along the harness.

It is thus possible to detect, in an effective manner, the parallel 2 or series 4 arcs which appear at connection interface members 38 of an electrical distribution route integrating such an optical fiber 14, as shown in FIG. 10. Each of connection interface members 38 is associated with a respective Bragg grating 20 having a specific characteristic wavelength $\lambda_1$, $\lambda_2$, $\lambda_3$, $\lambda_4$ (or, equivalently, a specific refractive index). In other words, within the same harness, each of the integrated Bragg gratings 20 in optical fiber 14 is located at a connection interface member 38 and has a specific refractive index which is different from the others.

In the example illustrated in FIGS. 3 and 4, the section of electrical harness 10 uses supports 12 of the spool type 14 for cable segregation, which keep the electrical cables at a distance from each other and retain them inside the structure of the aircraft. Optical fiber 14 may then advantageously be placed in the center of the electrical cable bundle and passed through a central hole made in the center of the segregation spools.

However, the invention is applicable to any harness configuration, whether it is segregated or not. For example, optical fiber 14 may be twisted around a harness composed of non-segregated electrical cables so that it lies in an environment close to the electrical power distribution network to be monitored.

Figure 5:
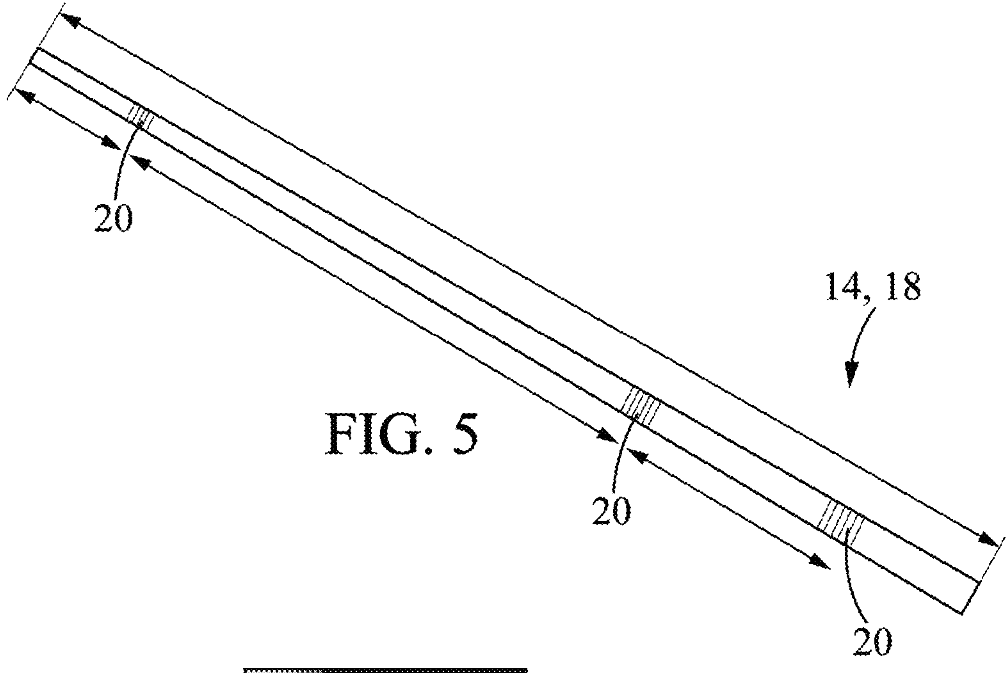
FIG. 5 shows an optical fiber with Bragg gratings, said optical fiber comprising three Bragg gratings.

As illustrated in FIG. 5, the deployed optical fiber 14 comprises Bragg gratings 20 spaced apart along a portion 18 which extends along cables 16.

In a known manner, a fiber with Bragg gratings or FBG (Fiber Bragg Grating) is a single-mode fiber, locally composed of successions of several silica-based layers whose thicknesses vary from one layer to another, causing local variations in the refractive index. Optical fiber 14 thus comprises a series of Bragg gratings 20 along the fiber.

In such a fiber with Bragg gratings, it is possible to calibrate, during its design:

- a number of Bragg gratings 20, each characterized by a specific characteristic wavelength, corresponding to a particular alternation of refractive indices of the silica core of the optical fiber,
- the position of each of Bragg gratings 20 in the fiber.

In practice, and based on the characteristics of the harness (es) to be protected, the following are then defined:

- a length of optical fiber 14 associated with the length of the harness to be protected; and
- for each position of a connection interface member 38 along the harness to be protected, a position of an associated Bragg grating 20 within optical fiber 14.

For this purpose, a digital mock-up (DMU) may be used, which is a three-dimensional representation of the aircraft and the harnesses, or any other equivalent specification may be used, to define the rules for manufacturing the optical fiber with Bragg gratings according to the invention for each harness to be protected along all or part of its length. The goal here is to manufacture an optical fiber 14 with Bragg gratings so that, once deployed along some or all of the harness, Bragg gratings 20 locally coincide with connection interface members 38 to be monitored. Connection interface members 38 to be monitored comprise those which connect two sections together and/or connect a section to the source or to a load. Connection interface members 38 are those identified as the upstream, downstream, and intermediate electrical interfaces in the prior art.

As for the distance between harness 10 and optical fiber 14, this is the result of a compromise: it must allow reliable detection of a local increase in temperature by the respective Bragg grating 20 of fiber 14 but must take into account the practical constraints of its installation.

There is a possibility for partial or total damage to optical fiber Bragg gratings from the hotter temperatures of an arc fault or its direct interaction with plasma. However, this failure will be preceded by a diagnosis of the presence of an electric arc by the diagnostic system coupled to the reflectometer, which will have given the cut-off order to the cut-off system. In a second stage, in the maintenance phase associated with any repairs required because of the arc's appearance before the cut-off, an inspection must also be carried out on the optical fiber in order to propose a repair if necessary.

It can be shown that arranging the optical fiber at a distance of less than 10 cm from a cable of the harness allows quickly capturing the sudden temperature variations linked to the creation of the fault. Depending on the types of connectors or terminals subject to potential electric arcs, the person skilled in the art will be able to refine this distance by taking into account the potential energy dissipated by the arc and its potential expansion.

Figure 6:
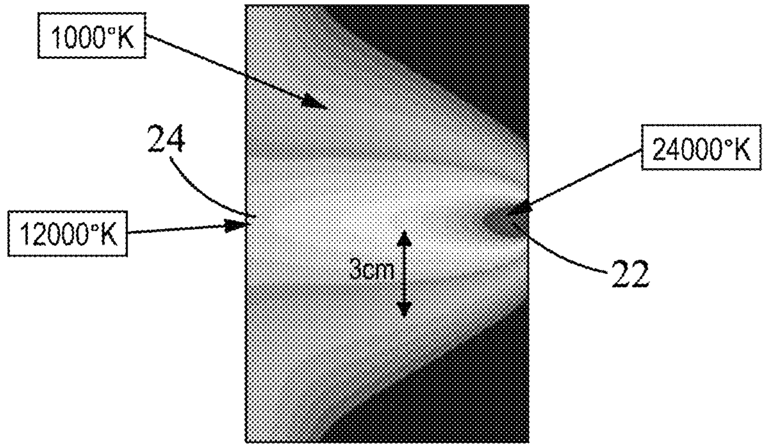
FIG. 6 shows a temperature distribution during the formation of an electric arc.

FIG. 6 illustrates an example of a temperature gradient of an electric arc occurring between a cathode 22 on the right and an anode 24 on the left. The illustration allows one to understand that the appearance of an electric arc generates a very strong temperature change in the nearby environment. A temperature gradient is systematic between the ambient gas and the center of the arc column, sometimes over several centimeters. The optical fiber with Bragg gratings is capable of measuring sudden temperature variations of very low amplitudes (down to a variation by one degree Celsius) compared to the variations observed in this illustration. It is therefore relevant to combine an optical fiber with Bragg gratings and a discriminative algorithm.

Indeed, in aeronautics, it is not uncommon to observe temperature variations. The location of the aircraft at different places on the planet, the flight cycles, and the local heating caused by other devices are all external factors that can result in temperature variations that are more or less slow. All equipment installed on an aircraft must be robust in dealing with these variations. This device therefore includes an algorithm capable of dissociating these environmental variations from the heat signatures generated by electric arcs.

As defined, optical fiber 14 with Bragg gratings is coupled at an upstream end to a reflectometer. An incident optical signal having an incident light spectrum is emitted by said reflectometer with a broad spectral band defined beforehand so that it encompasses the lines corresponding to the characteristic wavelengths specific to Bragg gratings 20 of optical fiber 14. In a known manner, part of this light flux is reflected by Bragg gratings 20 towards the reflectometer, which corresponds to the spectral signature of fiber 14: it contains all the lines corresponding to the wavelengths reflected by all Bragg gratings 20 arranged in said optical fiber.

Figures 7, 8, 9:
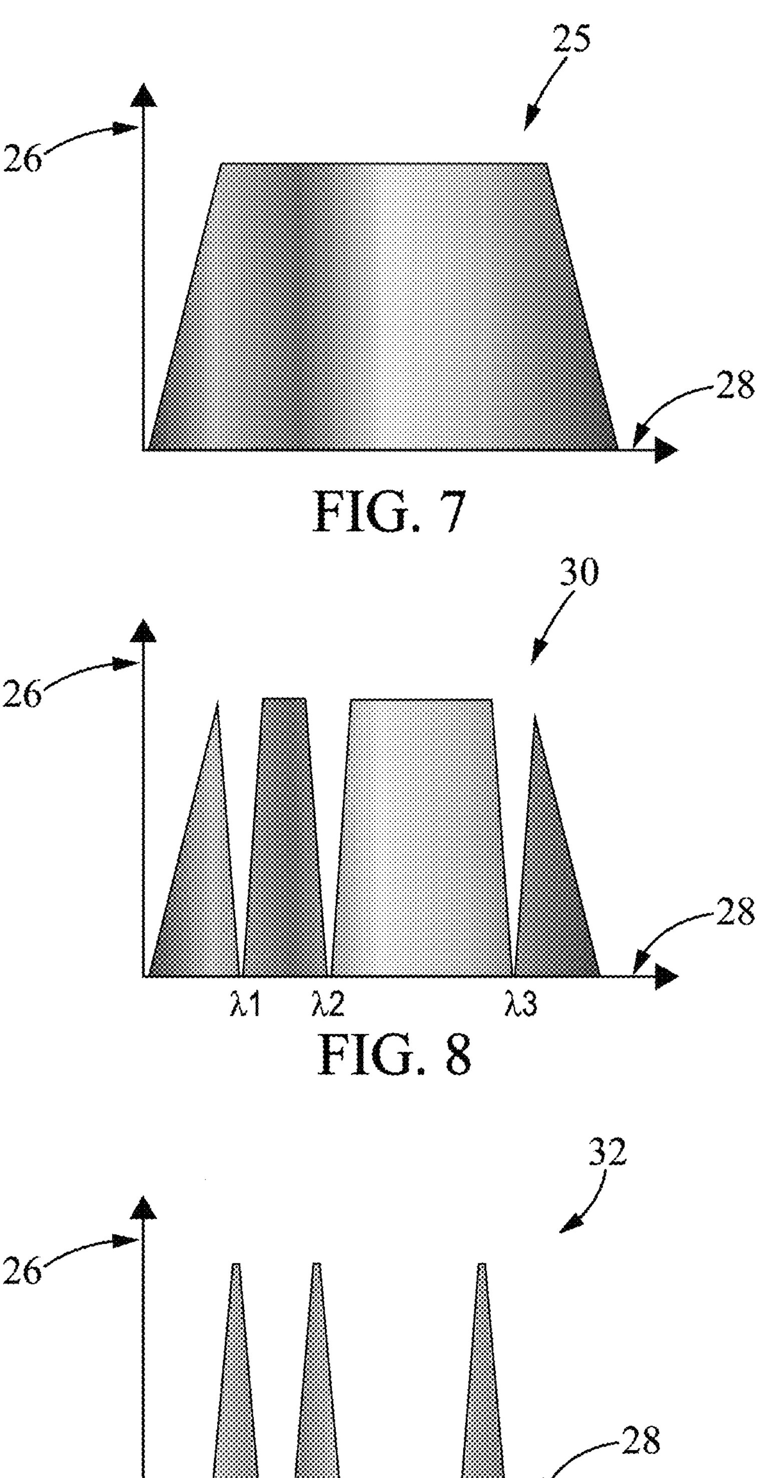
FIG. 7 shows an example of an incident spectrum emitted by an optical reflectometer at the upstream end of the optical fiber of FIG. 5.
FIG. 8 shows the spectrum transmitted at the downstream end of this optical fiber.
FIG. 9 shows the reflected spectrum returning to the upstream end of this optical fiber.

FIGS. 7 to 9 represent the light spectra respectively emitted, transmitted, and reflected by an optical fiber 14 with Bragg gratings 20 such as the one shown in FIG. 5, with the intensity 26 on the y axis and the wavelengths 28 on the x axis. FIG. 7 represents an incident light spectrum 25, emitted by a reflectometer at an upstream end of optical fiber 14. FIG. 8 illustrates the transmitted light spectrum 30, obtained at the other end (downstream) of optical fiber 14. FIG. 9 illustrates the light spectrum 32 that is reflected by optical fiber 14 back towards the reflectometer.

In the example shown, optical fiber 14 comprises three Bragg gratings 20, as identified in FIG. 5, with three different refractive indices defining three characteristic wavelengths specific to each Bragg grating 20, respectively $\lambda_1$, $\lambda_2$ and $\lambda_3$. By propagating through optical fiber 14 and through each Bragg grating 20, the result is that the wavelengths $\lambda_1$, $\lambda_2$ and $\lambda_3$ are not transmitted to the other end of the fiber, as illustrated in FIG. 8, but are reflected towards the reflectometer, as illustrated in FIG. 9. In other words, the reflected light spectrum comprises only three emission lines corresponding to these three wavelengths $\lambda_1$, $\lambda_2$ and $\lambda_3$.

FIG. 10 illustrates an electrical power distribution network 10 comprising a distribution route composed of three sections of electrical cables 16 interconnected by electrical connection interface members 38. Upstream of the distribution route, a source 8 represents either a power source or an electrical distribution cabinet as explained above in the presentation of the prior art. In both cases, this equipment has the role of powering the distribution route all the way to a downstream load 6. The upstream source 8 and the downstream load 6 are also connected to the distribution route via associated electrical connection interface members 38. The distribution route is associated with a diagnostic and detection device for diagnosing and detecting an electric fault, comprising an optical fiber 14 with Bragg gratings 20. In this example, optical fiber 14 is deployed along the distribution route between source 8 and load 6. The diagnostic and detection system is composed of fiber 14 with Bragg gratings 20 and an acquisition central processing unit 34 associated with optical reflectometer 36. These elements are also positioned upstream of the distribution route. Optical reflectometer 36 is coupled to the end of optical fiber 14 at the upstream side, meaning at the side towards source 8.

In this example, the optical fiber with Bragg gratings comprises four Bragg gratings 20 in order to correspond to the four electrical connection interface members 38. Series arcs 4 occur specifically at electrical connection interface members 38, which are therefore sensitive areas to be protected.

There may be a dedicated location in each electrical connection interface member 38 to accommodate optical fiber 14 inside electrical connection interface member 38, or optical fiber 14 may run next to electrical connection interface member 38.

Figure 11:
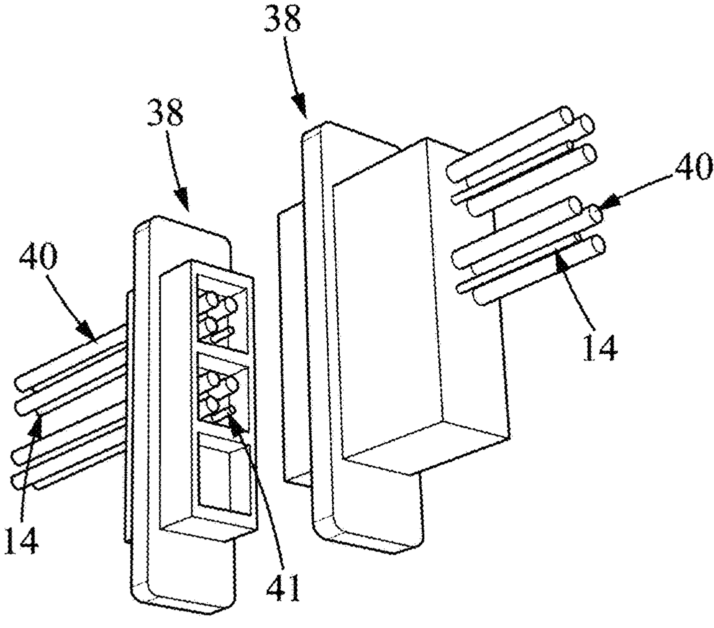
FIG. 11 shows an embodiment where the optical fiber extends inside a modular connector.

FIG. 11 illustrates one practical example of using a connection interface member 38, which is a multi-modular type of connector for accommodating optical fibers 14 according to the invention. In a known manner, such a connector comprises several modules or housings, three in the example shown, which can each accommodate and interconnect cables. In the example, two modules are used, each accommodating three power cables 40 and one optical fiber 14. A third module is not provided. Cables 40 are interconnected in a known manner in connection interface member 38, via male and female electrical contacts. Similarly, a coupling by optical connector 41 is provided to interconnect the two portions of optical fiber 14. Each of the two fiber portions will in practice be designed so that, after assembly, Bragg grating 20 associated with connector 38 is close to the respective optical connector 41, preferably at a distance of less than two centimeters from optical connector 41.

In one practical example, it is known to have up to twenty Bragg gratings 20 in optical fiber 14, which is suitable for detecting series arcs in aircraft harnesses, because the number of sections and therefore of intermediate connection interface members 38 is very generally less than ten.

The calibration of Bragg gratings 20 is chosen so as to obtain a good distribution of the specific characteristic wavelengths over the extent of the light spectrum emitted by the reflectometer. It is understood that this facilitates detecting a variation in characteristic wavelength and identifying the corresponding Bragg grating, and therefore locating the connection interface member affected by one or more series or parallel arcs.

The diagnosis is initiated by an initialization step, to obtain the reference spectral signature. This initialization step may be carried out for each flight before the distribution route is powered up, for example. During this initialization phase, optical reflectometer 36 emits an incident spectrum on optical fiber 14 with Bragg gratings, and receives a corresponding reflected spectrum 32. Reflected spectrum 32 becomes the reference spectrum characterizing the distribution route in its normal operation as defined above.

When the distribution route is powered up, the operational diagnosis can begin. Optical reflectometer 36 then continuously emits an incident spectrum at the upstream end of optical fiber 14 with Bragg gratings, which is the same spectrum as what was emitted during the initialization phase. Also continuously, optical reflectometer 36 receives the reflected spectrum at this same upstream end, hereinafter referred to as the current spectral signature, i.e. representative of the state at that moment, therefore the "current" state, of the distribution route that is being monitored.

Again continuously, the diagnostic system composed of an acquisition central processing unit 34 implements an algorithm for comparing the current spectral signature to the reference spectral signature. At the end of this comparison, the algorithm implemented by acquisition central processing unit 34 determines whether or not the electrical power distribution route is impacted by an electric arc.

The algorithm is advantageously capable of segregating temperature variations (which cause a shift of at least one of the characteristic wavelengths in the current spectral signature) resulting from the formation of an arc fault at a connection member 38, from temperature variations resulting from other external phenomena. Such an algorithm may for example be based on the speed of the temperature variation, which is very high for an arc fault.

Figure 12:
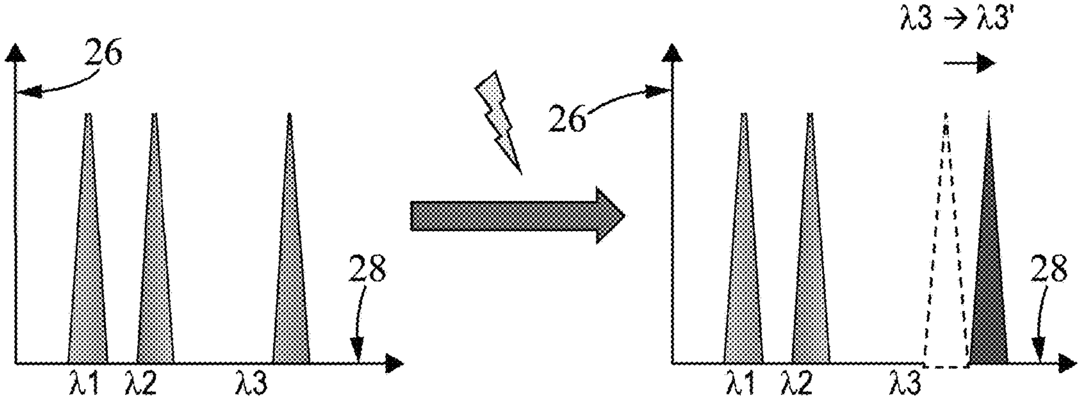
FIG. 12 shows the spectrum reflected by a fiber with Bragg gratings of a detection system according to the invention, corresponding to normal operation on the left, and on the right, to a spectrum reflected by this same fiber during the appearance of an arc fault.

FIG. 12 illustrates, on the left, the reference reflected light spectrum 32 resulting from the initialization step. On the right, it is a reflected light spectrum corresponding to the current spectral signature, obtained in the case where an arc fault has appeared between two electrical contacts in electrical connection interface member 38. It can thus be seen that the rise in temperature induced by this electric arc results in a variation in the characteristic wavelength of the Bragg grating placed nearby (which is paired with it). In the present example, it is the line corresponding to wavelength $\lambda_3$ which is shifted to the right, corresponding to a modified wavelength of wave $\lambda'_3$, which makes it possible to identify Bragg grating 20 concerned and therefore connection interface member 38 which is paired with it. According to the example in FIG. 12, the operational diagnosis therefore detects the appearance of an electric arc and determines its location to be within the third connector of the harness concerned.

In the event of a positive diagnosis during the operational diagnosis step, the diagnostic and detection device sends a command to open the line to the cut-off system associated with the distribution route impacted by the arc fault, in order to isolate at least the section of the distribution route that is impacted by the electric arc.

The operational diagnostic step continues to run during all aircraft missions, on the ground or in flight, until power is turned off to the distribution route to be monitored.

The optical fiber 14 with Bragg gratings 20 that is associated with such a diagnostic device allows reliably detecting and locating the series 4 or parallel 2 arc(s) that may occur within connection interface members 38, by exploiting the sudden temperature changes (the amplitude of the temperature variation may be low, on the order of 1° C.) at the location where the electric arc occurs. In the event that an electric arc is detected, a cut-off device is actuated in order to isolate the entire distribution route on which depends the damaged electrical connection interface member whose location is thus determined within the electrical power distribution network.

The invention claimed is:

1. A diagnostic and detection device for an electrical power distribution network (10) of an aircraft comprising a harness of electrical cables (40) forming an electrical distribution route between a source (8) and at least one load (6), said harness comprising at least one section connected in series between the source (8) and the load or loads (6) by at least one connection interface member (38), wherein the diagnostic and detection device diagnoses and detects an electric arc type fault occurring in said electrical distribution route, said diagnostic and detection device being arranged at the connection interface members (38);

the diagnostic and detection device comprising:

an optical fiber (14) laid along at least a portion of said distribution route and comprising at least one Bragg grating (20) positioned at each connection interface member (38), making it possible to associate with each connection interface member (38) a characteristic reference wavelength of the respective Bragg grating (20), the optical fiber (14) having a reference spectral signature comprising said characteristic wavelengths of said Bragg gratings (20), an optical reflectometer (36) coupled to an upstream end of the optical fiber (14) and configured to emit a reference optical signal, said reference optical signal being composed of an incident light spectrum including the characteristic wavelength of each Bragg grating (20) of the optical fiber (14), and to receive a reflected optical signal composed of a light spectrum reflected by the optical fiber (14) which defines a current spectral signature of the optical fiber (14), an acquisition central processing unit (34) configured to detect and locate one or more arc faults over one or more connection interface members (38), on the basis of a comparison of the current spectral signature with a reference spectral signature of the optical fiber.

2. The device according to claim 1, wherein the at least one Bragg grating (20) is arranged at a distance of up to 10 cm from the electrical interface member (38).

3. The device according to claim 1, wherein the diagnostic and detection device is adapted to actuate a cut-off device configured to isolate said electrical distribution route from the rest of the electrical power distribution network (10), and wherein the acquisition central processing unit (34) is configured to send an arc fault detection signal for an arc fault located at the connection interface member (38) associated with the cut-off device in order to actuate the cut-off device.

4. The device according to claim 1, wherein the reflectometer (36) is configured to, before power is supplied to the distribution route, emit the reference optical signal and receive a reflected optical signal composed of a reflected light spectrum that is reflected by the optical fiber (14), said reflected light spectrum defining the reference spectral signature of the optical fiber (14).

5. The device according to claim 1, wherein the reflectometer (36) is configured to emit the reference optical signal and receive the reflected optical signal defining the current spectral signature of the optical fiber in a continuous manner, during the supply of power to the distribution route.

6. The device according to claim 1, wherein the acquisition central processing unit (34) is configured to compare the current spectral signature and the reference spectral signature of the optical fiber (14) by detecting a shift between one of the characteristic wavelengths of one of the Bragg gratings (20) in the current spectral signature and in the reference spectral signature of the optical fiber (14).

7. Method A method for detecting a series arc, using the device according to claim 1 in an electrical power distribution network of an aircraft, the method comprising the following steps:

emitting a reference optical signal, said reference optical signal being composed of an incident light spectrum including the characteristic wavelength of each Bragg grating (20) of the optical fiber (14), and receiving a reflected optical signal composed of a light spectrum reflected by the optical fiber (14) and defining a current spectral signature of the optical fiber (14), comparing said current spectral signature with a reference spectral signature by using the acquisition central processing unit (34), and detecting and locating an arc fault if there is such.

8. The method according to claim 7, further comprising the following step:

in the event that an arc fault is detected at a connection interface member (38), sending an arc fault detection signal for an arc fault located at the connection interface member (38) in question, to a cut-off device in order to actuate said cut-off device.

9. The method according to claim 7, further comprising the following steps:

before supplying power to the distribution route, emitting a reference optical signal, and receiving a reflected optical signal composed of a light spectrum reflected by the optical fiber (14) and defining the reference spectral signature of the optical fiber (14), and storing the reference spectral signature in the acquisition central processing unit (34).

10. The method according to claim 7, wherein the steps of emitting the reference optical signal and comparing the current spectral signature and the reference spectral signature are implemented continuously during the supply of power to the distribution route.

11. The method according to claim 7, wherein the detection of a possible arc fault is done by comparing the current spectral signature and the reference spectral signature, by measuring a shift of at least one characteristic wavelength of one of the Bragg gratings (20).

12. The method according to claim 7, wherein the step of comparing the spectral signature comprises implementing a segregation algorithm, capable of segregating a temperature change resulting from an arc fault from a temperature change resulting from an external cause.

13. An aircraft comprising a diagnostic and detection device for an electrical power distribution network (10) according to claim 1.

* * * * *